US009613511B2

(12) United States Patent
Ghose et al.

(10) Patent No.: US 9,613,511 B2
(45) Date of Patent: Apr. 4, 2017

(54) DETECTION SYSTEM

(71) Applicant: Tata Consultancy Services Ltd., Mumbai (IN)

(72) Inventors: Avik Ghose, Kolkata (IN); Vivek Chandel, Kolkata (IN); Chirabrata Bhaumik, Kolkata (IN); Arpan Pal, Kolkata (IN)

(73) Assignee: Tata Consultancy Services Ltd. (IN)

( * ) Notice: Subject to any disclaimer, the term of this patent is extended or adjusted under 35 U.S.C. 154(b) by 99 days.

(21) Appl. No.: 14/590,522

(22) Filed: Jan. 6, 2015

(65) Prior Publication Data

US 2015/0199889 A1 Jul. 16, 2015

(30) Foreign Application Priority Data

Jan. 13, 2014 (IN) ........................... 111/MUM/2014

(51) Int. Cl.

| | |
|---|---|
| ***G08B 13/24*** | (2006.01) |
| ***G08B 13/22*** | (2006.01) |
| ***G07C 9/00*** | (2006.01) |
| *B60R 25/00* | (2013.01) |
| *H04N 13/02* | (2006.01) |
| *G01R 19/00* | (2006.01) |

(52) U.S. Cl.

CPC ............... *G08B 13/22* (2013.01); *G07C 9/00* (2013.01); *G07C 9/00111* (2013.01)

(58) Field of Classification Search

CPC .................................. G08B 13/22; G07C 9/00

USPC .......................................................... 340/551

See application file for complete search history.

(56) References Cited

U.S. PATENT DOCUMENTS

| | | | | | |
|---|---|---|---|---|---|
| 4,027,234 | A | 5/1977 | Mosnier | | |
| 2004/0135687 | A1* | 7/2004 | Keene | G01V 11/00 | 340/551 |
| 2005/0237197 | A1* | 10/2005 | Liebermann | G08B 13/2408 | 340/572.6 |
| 2010/0007338 | A1 | 1/2010 | Schultz | | |
| 2011/0089929 | A1 | 4/2011 | Jackson et al. | | |
| 2012/0212343 | A1* | 8/2012 | Grunenberg | G06K 7/10009 | 340/572.3 |

(Continued)

FOREIGN PATENT DOCUMENTS

| | | | |
|---|---|---|---|
| DE | 102009057258 | A1 | 6/2011 |
| WO | 2005001494 | A2 | 1/2005 |

*Primary Examiner* — Jack K Wang

(74) *Attorney, Agent, or Firm* — Blueshift IP, LLC; Robert Plotkin

(57) ABSTRACT

A detection system for detecting the presence and direction of a subject moving through a doorway is disclosed. The system comprises magnets disposed on the doorway, a communication device, typically a smartphone and a server. The magnets are positioned on the doorway to create a magnetic field across the doorway. When the subject having the smartphone on the body passes through the doorway, a magnetometer in the smartphone senses perturbations caused by the magnetic field and generates signals corresponding to the sensed perturbations and a processor of the smartphone processes the signals to detect the presence and direction of the subject through the doorway. The data generated by the processor and a unique identification associated with the smartphone is transmitted to the remotely located server.

16 Claims, 2 Drawing Sheets

(56) References Cited

U.S. PATENT DOCUMENTS

| | | | | |
|---|---|---|---|---|
| 2014/0070790 | A1* | 3/2014 | Fujiwara ................ | G01R 21/00<br>324/76.11 |
| 2014/0240464 | A1* | 8/2014 | Lee ......................... | G01S 17/08<br>348/47 |

* cited by examiner

DETECTION SYSTEM

FIELD OF DISCLOSURE

The present disclosure relates to detection of entry/exit of subjects in premises.

DEFINITIONS

The expression 'subject/s' used in the context of this disclosure refers to persons and/or objects including, but not limited to, carts, vehicles, and the like.

The expression 'doorway' used in the context of this disclosure refers to, but is not limited to, gates, entrances, exits, doors, arches and the like that may be utilized to provide access to premises.

The expression 'magnetometer' used in the context of this disclosure refers to devices used for measuring parameters including, but not limited to, intensity, magnitude, direction and the like, of a magnetic field.

These definitions are in addition to those expressed in the art.

BACKGROUND

Entry/Exit of subjects in premises is typically detected and recorded by means of a smartcard based system wherein a subject while entering/exiting a premises punches/swipes the smartcard in an electronic unit on a doorway of the premises. Alternatively biometric systems are also used wherein the subject while entering/exiting the premises displays typically a finger on an electronic unit on the doorway of the premises. However, smartcards can be easily be misplaced or damaged resulting in the subject getting stranded within/outside the premises. Biometric systems are not always reliable, as subjects with rough fingers from laboring for example, may not be accurately identified by the electronic unit. Use of these systems in places where lot of subjects enter/exit the premises can result in long queues, causing a lot of inconvenience. Furthermore, a large amount of data needs to be kept in the electronic unit at the doorway, resulting in increased technical complexity and also increasing the cost of the system. Moreover, these systems require continuous power supply and even a slight disruption in power supply can shut down the system and/or electrically damage the system. In places with regular power disruptions, these systems need to be backed up with alternate power supply through generators and the like, leading to further increase in the overall costs of maintaining such systems.

With advancements in technologies, the entry/exit of subjects in premises is detected by implementing systems that employ WiFi and Radio Frequency (RF)/GPS technologies. In such systems a virtual boundary is created around a doorway or a geographical area that can trigger an action in a cellular device or other portable electronic device. When a user with a cellular device implementing the system enters/exits the boundary an automatic alert such as an instant message, an email and the like, is sent. For example, an alert can be sent to a child's parents when the child enters/exits a designated area such as a school or a house. The virtual boundary is created around a doorway of the school/house whereby an alert is automatically sent to the child's parents when the child having a cellular phone implementing the system enters/exits the school/house. Similarly, an alert can be sent to a receiver of a cargo and/or a sender of the cargo when a cargo vehicle enters a doorway of a premise such as a factory. The virtual boundary is created around the doorway of the premises whereby an alert is automatically sent to the receiver of the cargo and/or the sender of the cargo when the cargo vehicle with a cellular phone implementing the system enters/exits the premises.

However, a drawback with systems that use WiFi technologies is that a user of the cellular phone implementing the system can choose to switch-off the WiFi in the cellular phone to save battery and later forget to switch-on the WiFi. As a result the entry/exit of the user cannot be detected. Furthermore, these systems necessarily need active WiFi connections at every doorway thereby requiring heavy and power intensive infrastructure which increases the overall cost of using these systems.

Systems that use RF/GPS technologies, apart from having the drawback of requiring heavy and extensive power intensive infrastructure, suffer from lack of regulatory compliance as these systems operate on licensed spectrum.

Hence there is a need for a system that can overcome the aforementioned drawbacks and detect the entry/exit of subjects without the need for extensive infrastructure and at the same time is cost effective.

Objects

Some of the objects of the present disclosure aimed to ameliorate one or more problems of the prior art or to at least provide a useful alternative are listed herein below.

An object of the present disclosure is to provide a detection system for detecting the direction of a subject passing through a doorway.

Another object of the present disclosure is to provide a detection system that does not require heavy infrastructure.

Another object of the present disclosure is to provide a detection system that consumes less power.

Another object of the present disclosure is to provide a detection system that does not have regulatory compliance issues.

Another object of the present disclosure is to provide a detection system that is cost effective.

Other objects and advantages of the present disclosure will be more apparent from the following description when read in conjunction with the accompanying figures, which are not intended to limit the scope of the present disclosure.

SUMMARY

In accordance with an aspect of the present disclosure, there is provided a detection system for detecting the presence and direction of a subject moving through a doorway, the system comprising:

- at least two magnets positioned on the doorway in a pre-determined orientation to create a magnetic field across the doorway;
- a communication unit on the body of the subject, the communication unit comprising:
  - a magnetometer adapted to sense perturbations caused by the magnetic field in the event that the subject passes through the doorway and generate signals corresponding to the sensed perturbations;
  - a processor cooperating with the magnetometer, the processor adapted to process the signals generated by the magnetometer to detect the presence of the subject and the direction of the subject through the doorway, the processor further adapted to generate data related to the presence of the subject, the direction of the subject through the doorway, the location of the doorway and a unique identification associated with the communication unit;

a transmitter adapted to wirelessly transmit the data;

a server remotely located from the doorway and communicating with the communication unit to receive the data related to the presence and direction of the subject through the doorway, the location of the doorway and the unique identification.

Typically, the direction of the subject corresponds to entry/exit of the subject through the doorway.

Typically, the magnets are at least one of permanent magnets and electromagnets.

Typically, the magnets are co-axially oriented on the doorway such that the direction of the magnetic field created across the doorway is from the North Pole of a first magnet to the South Pole of a second magnet.

Generally, the communications unit is a smartphone and the unique identification is the IMEI (International Mobile Equipment Identity) number of the smartphone.

Typically, the communications unit is on the body of the subject in a position corresponding to positive Y-axis of the communications unit being oriented towards the ventral half of the coronal plane of the subject.

Typically, the processor implements:

a peak detection module adapted to detect at least one peak signal from the signals generated by the magnetometer;

a validating module adapted to validate the detected peak signal;

a vector determination module adapted to determine:

a gravitational vector based on signals generated by an accelerometer of the communication unit and the validated peak signal;

a corrected magnetic field vector based on a vector corresponding to the magnetic field across the doorway and an ambient field vector; and a direction detection module adapted to detect the presence of the subject and the direction of the subject through the doorway based on the gravitational vector and the corrected magnetic field vector and generate data corresponding to the detected presence and direction of the subject through the doorway.

Additionally, the vector determination module comprises:

a low pass filter module adapted to filter signals generated by the accelerometer, wherein signals generated by the accelerometer at the same time instant of the detected peak signal are filtered;

an averaging module adapted to calculate mean of the filtered signals in X, Y and Z axes and further calculate summation of the mean of the filtered signals in X, Y and Z axes to determine the gravitational vector; and a subtractor module adapted to subtract the ambient field vector from the vector corresponding to the magnetic field across the access means to determine the corrected magnetic field vector.

Typically, the server implements:

a comparator module adapted to compare the received data with a previously received data to detect an anomaly in the received data; the comparator module, in the event of detecting the anomaly, further adapted to compare the received data with data corresponding to a video footage of the subject passing through the doorway and correct the anomaly; and a display module cooperating with the comparator module, the display module adapted to display the direction of the subject based on the received data and the anomaly, if any, on a display unit of the server.

Additionally, the display module comprises a user interface, and the comparator module, in the event of detecting the anomaly, enables a user to view the video footage of the moving subject passing through the doorway on the display unit and manually correct the anomaly through the user interface.

Additionally, the system further comprises a location detection system to detect the location of the doorway through which said subject passes.

Typically, the location detection system is selected from the group consisting of an RFID system and a GPS tracking system.

In accordance with another aspect of the present disclosure, there is provided a method for detecting the presence and direction of a subject moving through a doorway, the method comprising the following steps:

positioning at least two magnets on a doorway in a pre-determined orientation to create a magnetic field across the doorway;

sensing perturbations caused by the magnetic field in the event that the subject with a communicating unit passes through the doorway and generating signals corresponding to the sensed perturbations;

processing the signals corresponding to the sensed perturbations;

detecting the presence of the subject and the direction of the subject through the doorway and generating data related to the presence of the subject, the direction of the subject through the doorway, and a unique identification associated with the communication unit;

transmitting the data; and receiving the data related to the presence and direction of the subject through the doorway and the unique identification.

Typically, the step of processing the signals includes the following steps:

detecting at least one peak signal from the signals corresponding to the sensed perturbations;

validating the detected peak signal;

determining a gravitational vector based on signals generated by an accelerometer of the communication unit and the validated peak signal;

determining a corrected magnetic field vector based on a vector corresponding to the magnetic field across the doorway and an ambient field vector; and detecting the presence of the subject and the direction of the subject through the doorway based on the gravitational vector and the corrected magnetic field vector.

Additionally, the step of determining the gravitational vector includes the following steps:

filtering the signals generated by the accelerometer, such that the signals at the same time instant of the detected peak signal are filtered; and calculating mean of the filtered signals in X, Y and Z axes and summation of the mean of the filtered signals in X, Y and Z axes to determine the gravitational vector.

Additionally, the step of determining the corrected magnetic field vector includes the following steps:

determining the ambient magnetic field vector; and subtracting the ambient field vector from the vector corresponding the magnetic field across the access means to determine the corrected magnetic field vector.

Additionally, the method further comprising the following steps:

comparing the received data with a previously received data to detect an anomaly in the received data;

comparing the received data with data corresponding to a video footage of the subject passing through the doorway in the event of detecting the anomaly, and correcting the anomaly; and displaying the direction of the moving subject based on the received data, and displaying the anomaly, if any.

Additionally, the step of comparing the received data includes the step of enabling a user to view a video footage of the moving subject passing through the doorway, in the event of detecting the anomaly and manually correcting the anomaly.

BRIEF DESCRIPTION OF ACCOMPANYING DRAWINGS

The detection system of the present disclosure will now be described with the help of the accompanying drawings, in which.

DETAILED DESCRIPTION

Figure 1:
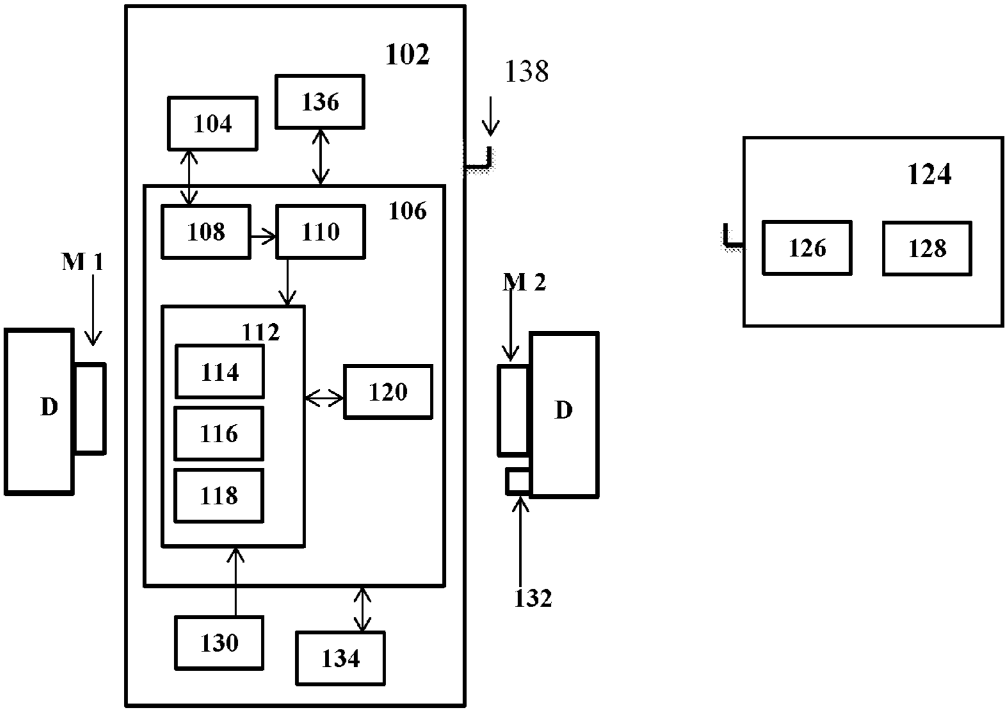
FIG. 1 illustrates a block diagram representation of a setup of a detection system in accordance with an embodiment of the present disclosure.

Entry/Exit of subjects in a premises is typically detected by smartcard based system or biometric systems. However, smartcards can easily be misplaced or damaged and biometric systems are not always reliable. Furthermore, these systems require continuous power supply and the overall cost of maintaining such systems is high.

Systems employing WiFi and RF technologies for detecting entry/exit of subjects in premises suffer from the need for active WiFi connections at doorways of all premises, heavy and power intensive infrastructure which increases the overall cost of the system and lack of regulatory compliance as these systems operate on licensed spectrum. Furthermore, these systems detect the subject and not the device.

Thus to overcome these aforementioned limitations, the present disclosure envisages a detection system for detecting the presence and direction of a subject passing through a doorway. The system of the present disclosure uses magnets disposed on the doorway and a magnetometer to detect the direction of the subject. Unlike RF antennas, the magnetometer cannot be switched-off and moreover, the system does not suffer from any regulatory compliance issues.

The detection system of the present disclosure will now be described with reference to the embodiments shown in the accompanying drawings. The embodiments do not limit the scope and ambit of the disclosure. The description relates purely to the examples and preferred embodiments of the disclosed tool and its suggested applications.

The system herein and the various features and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The detection system of the present disclosure comprises magnets disposed on a doorway, a communication device and a server. In accordance with one embodiment, the magnets are permanent magnets and the communication unit/device is a smartphone having at least a processor, a magnetometer and a transmitter. In accordance with another embodiment, the magnets are electromagnets. The system of the present disclosure automates the process of detecting entry/exit of smartphones into a premises. This result of detection is communicated to the server. The system can also be used in a disconnected manner wherein the system takes a decision offline. The method employed by the system determines a "relative peak" which may even be inverted. The method employed by the system includes a peak detection method which uses relative measures. The relative measure will always provide indication of a homogeneous magnetic field which is much greater than an ambient magnetic field of earth, ferrite materials or even electronic gadgets in the vicinity of the magnets disposed on the doorway. When this is combined with a known direction of movement of the smartphone, the system gives a clear indication of whether a subject with the smartphone has entered/exited the premises.

Referring to FIG. 1, a block diagram representation of a setup of the detection system in accordance with an embodiment of the present disclosure is illustrated. Magnets M1 and M2 are co-axially positioned on the doorway (D) such that the North Pole of magnet M1 and the South Pole of magnet M2 points outwards. This creates a magnetic field across the doorway. The direction of the net magnetic field (including the ambient field) created across the doorway is approximately from M1 to M2.

When the subject having a smartphone (communication unit) 102 on the body passes through the doorway, the magnetometer 104 in the smartphone senses perturbations caused by the magnetic field and generates signals corresponding to the sensed perturbations. The processor 106 of the smartphone 102 cooperates with the magnetometer 104 and processes the signals generated by the magnetometer 104 to detect the presence of the smartphone 102 and the direction of the smartphone 102 and thereby the presence and direction related to entry/exit of the subject through the doorway (D). The processor 106 generates data related to the presence and direction of the smartphone 102 and thereby the presence and direction related to entry/exit of the subject through the doorway (D), the location of the doorway (D), and a unique identification associated with the smartphone 102. Typically, the unique identification is the IMEI (International Mobile Equipment Identity) number of the smartphone 102. The transmitter 138 wirelessly transmits the data to the server 124 which is remotely located from the doorway (D) and in communication with the smartphone 102. The data received by the server 124 relates to the presence and direction of the subject through the doorway (D) and the unique identification.

The processor 106 of the smartphone 102 implements a peak detection module 108, a validating module 110, a vector determination module 112 and a direction detection module 120. The peak detection module 108 detects a peak signal from the signals generated by the magnetometer 104. The validating module 110 validates the detected peak signal. The vector determination module 112 determines a gravitational vector based on signals generated by a three-axis accelerometer 130 of the smartphone 102 and the validated peak signal, and further determines a corrected magnetic field vector based on a vector corresponding to the magnetic field across the doorway (D) and an ambient field vector. The vector determination module 112 comprises a low pass filter module 114, an averaging module 116 and a subtractor module 118. The low pass filter module 114 filters signals generated by the accelerometer 130, wherein signals generated by the accelerometer 130 at the same time instant of the detected peak signal are filtered. The averaging module 116 calculates mean of the filtered signals in X, Y and Z axes and further calculates summation of the mean of the filtered signals in X, Y and Z axes to determine the gravitational vector. The subtractor 118 module subtracts the ambient field vector from the vector corresponding to the magnetic field across the access means to determine the corrected magnetic field vector. The direction detection module 120 detects the direction of the smartphone 102 and thereby the subject through the doorway (D) based on the gravitational vector and the corrected magnetic field vector and generates data corresponding to the detected presence and direction of the subject.

In accordance with one embodiment, the server 124 implements a comparator module 126 and a display module 128. The comparator module 126 compares the received data with a previously received data to detect an anomaly in the received data. Furthermore the comparator module 126, in the event of detecting the anomaly, further compares the received data with data corresponding to a video footage of the subject passing through the doorway and corrects the anomaly. The display module 128 cooperates with the comparator module 126 to display the direction of the subject based on the received data and the anomaly, if any, on a display unit of the server 124. The video footage is typically obtained from a CCTV camera (not shown in figure) installed at the doorway (D). In accordance with one more embodiment, display module 128 comprises a user interface whereby the comparator module 126, in the event of detecting the anomaly, enables a user to view the video footage of the subject passing through the doorway (D) on the display module 128 and manually correct the anomaly through a user interface (not shown in figure).

The detection system of the present disclosure is augmented by a location detection system to detect the location of each doorway through which the subject passes in a premises having a plurality of doorways. In accordance with one embodiment, the location detection system comprises an RFID system. After the entry of the subject within the premises through a main doorway, the server checks RFID readers 132 located at multiple doorways within the premises to detect the location of each doorway through which the subject passes. Typically, the smartphone on the body of the subject includes an RFID tag 134 which is detected by the RFID reader 132 to detect the location of each doorway through which the subject passes.

In accordance with one more embodiment, the location detection system comprises a GPS tracking system 136. After the exit of the subject from the premises, the server checks the GPS tracking system 136 to detect the location of the smartphone 102 by detecting the telephone number or the unique identification of the smartphone 102. A database (not shown in figure) in the server 124 comprises the GPS co-ordinates of gross location around the premises, whereby the smartphone 102 is tracked to detect the location of the subject.

Additionally, the server 124 of the system upon detecting an anomaly, activates the GPS tracking system 136 and/or the RFID system to detect the location of the subject and correct the anomaly.

Figure 2:
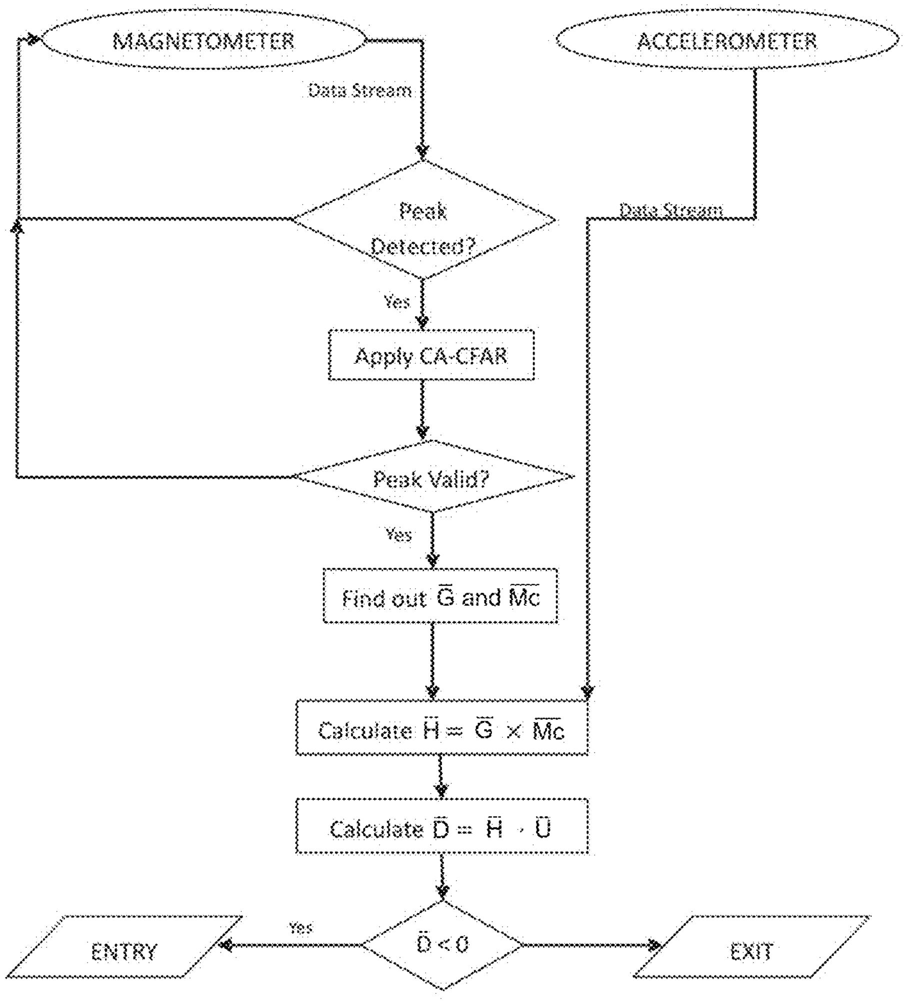
FIG. 2 illustrates a flow chart depicting the steps involved in a method of detecting a subject passing through a doorway in accordance with an embodiment of the present disclosure.

Referring to FIG. 2, a flow chart depicting the steps involved in a method of detecting a subject passing through a doorway in accordance with an embodiment of the present disclosure. The method is employed by the detection system of the present disclosure. Typically, the smartphone is on the body of the subject in a position such that the positive Y-axis of the smartphone always points in the ventral half of the subject's coronal plane while the subject passes through the doorway. The vector pointing towards user direction is denoted by $\vec{U}$. The direction of the subject can be obtained from techniques known in the art such as GPS, WiFi tracking or phone inertial sensors.

When the subject having the smartphone on the body passes through the doorway, the magnetic field created across the doorway generates a relatively high magnitude peak signal than the signals from the ambient magnetic field. The peak is detected by the peak detection module by employing a standard peak detection method wherein a signal is deemed as a peak signal if it is greater within a defined number of samples, $N_S$, which depends on the sampling rate, $F_S$, of the magnetometer. In the method employed by the peak detection module, $N_S=F_S/5$.

The detected peak signal is validated by the validating module by employing a cell-averaging CFAR (Constant False Alarm Rate) method, wherein the number of guard cells, $N_G$, and number of averaging cells, $N_A$, depends on $F_S$. In the method employed by the validating module, $N_G=F_S/5$ and $N_A=F_S/2$.

Thus, the time instant when the peak signal is detected is denoted by $T_P$ and the related specific signal is denoted by $S_P$.

Once a valid peak signal in the magnetic field data stream has been determined, the vector determination module determines a gravitational vector which is a vector pointing towards the gravity, $\vec{G}$ and the corrected magnetic field vector, $\vec{M_c}$.

For determining $\vec{G}$, the three-axis accelerometer embedded in the smartphone is used. Firstly, a low-pass filter with a specific cutoff frequency is applied to the accelerometer signals near the signals which are around the same time instant, $T_N$, when the peak signal was detected. The low pass filter module of the vector determination module filters $F_S/10$ samples from $\{S_P-(F_S/10-1)\}$ to $\{S_P\}$. Secondly, the averaging module calculates mean of the filtered samples in all the three axis, denoted by $g_x$, $g_y$ and $g_z$.

The averaging module then calculates the gravitational vector expressed as:

$$\vec{G}=g_x\hat{x}+g_y\hat{y}+g_z\hat{z}.$$

The magnetic field as mentioned herein above is approximately from M1 to M2 (as in the setup illustrated in FIG. 1). This field also includes the effect of the ambient field, which needs to be removed. In order to achieve this, an ambient field vector, $\vec{A}$ is determined by the vector determination module by:

$$\vec{A}=a_x\hat{x}+a_y\hat{y}+a_z\hat{z},$$

wherein, $a_x$ is the mean of the x-axis magnetometer signals which are within the time period $T_P$-1.5 to $T_P$-0.5.

The observed magnetic field vector, measured directly from magnetometer signals is denoted by $\vec{M_o}$.

Thus the corrected magnetic field vector $\vec{M_c}$ is determined by subtractor module of the vector determination module as:

$$\vec{M_c}=\vec{M_o}-\vec{A}$$

Once $\vec{G}$ and $\vec{M_c}$ have been determined, the direction determination module makes the decision based on $\vec{U}$ whether the user has moved in or out of the gate as shown in FIG. 2, where x denotes vector cross product and • denotes vector dot product.

Thus the method employed by the detection system of the present disclosure for detecting a subject passing through a doorway comprises the following steps:

- positioning at least two magnets on a doorway in a pre-determined orientation to create a magnetic field across the doorway;
- sensing unique perturbations caused by the magnetic field in the event that the subject with a communicating unit passes through the doorway and generating signals corresponding to the sensed perturbations;
- processing the signals corresponding to the sensed perturbations, wherein the processing includes:
  - detecting at least one peak signal from the signals corresponding to the sensed perturbations;
  - validating the detected peak signal;
  - determining a gravitational vector based on signals generated by an accelerometer of the smartphone and the validated peak signal, wherein the gravitational vector is determined by:
    - filtering the signals generated by the accelerometer, such that the signals at the same time instant of the detected peak signal are filtered; and
    - calculating mean of the filtered signals in X, Y and Z axes and summation of the mean of the filtered signals in X, Y and Z axes to determine the gravitational vector;
  - determining a corrected magnetic field vector based on a vector corresponding to the magnetic field across the doorway and an ambient field vector, wherein the corrected field vector is determined by:
    - determining the ambient magnetic field vector; and
    - subtracting the ambient field vector from the vector corresponding the magnetic field across the access means to determine the corrected magnetic field vector;
  - detecting the presence of the subject and the direction of the subject through the doorway based on the gravitational vector and the corrected magnetic field vector; and
  - generating data related to the identified doorway, the presence of the subject, the direction of the subject through the doorway, the location of the doorway and a unique identification associated with said communication unit;
- transmitting the data;
- receiving the data related to the identified doorway, the presence and direction of the subject through the doorway, the location of the doorway and the unique identification.

Additionally, the method as mentioned herein above includes the following steps:

- comparing the received data with a previously received data to detect an anomaly in the received data;
- comparing the received data with data corresponding to a video footage of the subject passing through the doorway in the event of detecting the anomaly and correcting the anomaly, including:
  - enabling a user to view a video footage of the moving subject passing through the doorway, in the event of detecting the anomaly and manually correcting the anomaly; and
- displaying the direction of the moving subject based on the received data, and displaying the anomaly.

Thus the detection system of the present disclosure detects the entry/exit of subjects without the need for extensive infrastructure, consumes less and at the same time is cost effective.

Technical Advancements and Economic Significance

The technical advancements offered by the detection system of the present disclosure includes the realization of:

- detecting the direction of a subject passing through a doorway;
- Detection the direction without requiring heavy infrastructure;
- less power consumption;
- no regulatory compliance issues; and
- cost effectiveness.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The use of the expression "at least" or "at least one" suggests the use of one or more elements or ingredients or quantities, as the use may be in the embodiment of the invention to achieve one or more of the desired objects or results.

Any discussion of documents, materials, devices, articles or the like that has been included in this specification is solely for the purpose of providing a context for the invention. It is not to be taken as an admission that any or all of these matters form part of the prior art base or were common general knowledge in the field relevant to the invention as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the invention, unless there is a statement in the specification specific to the contrary.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

What is claimed is:

1. A detection system for detecting the presence and direction of a subject moving through a doorway amongst a plurality of doorways in a premises, said system comprising:

- at least two magnets positioned on said doorway in a pre-determined orientation to create a magnetic field across said doorway;
- a communication unit on the body of said subject, said communication unit comprises:

a three-axis accelerometer adapted to sense acceleration experienced by said communication unit and generate signals corresponding to sensed acceleration;

a magnetometer adapted to sense perturbations caused by said magnetic field in the event that said subject passes through said doorway and generate signals corresponding to the sensed perturbations;

a processor cooperating with said magnetometer and said accelerometer, said processor adapted to process the signals generated by said magnetometer and said accelerometer to detect a presence of said subject and a direction of said subject through said doorway, said processor further adapted to generate data related to the presence of said subject, the direction of said subject through the doorway, a location of said doorway amongst the plurality of doorways and a unique identification associated with said communication unit, wherein said processor implements:

a peak detection module adapted to detect a peak signal from the signals generated by said magnetometer;

a validating module adapted to validate the detected peak signal;

a vector determination module adapted to determine:

a gravitational vector based on signals generated by said accelerometer of said communication unit and the validated peak signal;

a corrected magnetic field vector based on a vector corresponding to said magnetic field across the doorway and an ambient field vector; and a direction detection module adapted to detect the presence of said subject and the direction of said subject through said doorway based on said gravitational vector and said corrected magnetic field vector and generate data corresponding to the detected presence and direction of said subject through said doorway;

a transmitter adapted to wirelessly transmit said data; and a server remotely located from said doorway and communicating with said communication unit to receive said data related to the presence and the direction of said subject through said doorway, location of said doorway and said unique identification.

2. The system as claimed in claim 1, wherein the direction of said subject corresponds to entry/exit of said subject through said doorway.

3. The system as claimed in claim 1, wherein said magnets are at least one of permanent magnets and electromagnets.

4. The system as claimed in claim 1, wherein said magnets are co-axially oriented on said doorway such that the direction of said magnetic field created across said doorway is from the North Pole of a first magnet to the South Pole of a second magnet.

5. The system as claimed in claim 1, wherein said communication unit is a smartphone and said unique identification is the IMEI (International Mobile Equipment Identity) number of the smartphone.

6. The system as claimed in claim 1, wherein said communication unit is on the body of said subject in a position corresponding to positive Y-axis of the communication unit being oriented towards the ventral half of the coronal plane of said subject.

7. The system as claimed in claim 1, wherein said vector determination module comprises:

a low pass filter module adapted to filter signals generated by said accelerometer, wherein signals generated by said accelerometer at the same time instant of the detected peak signal are filtered;

an averaging module adapted to calculate mean of the filtered signals in X, Y and Z axes and further calculate summation of the mean of the filtered signals in X, Y and Z axes to determine said gravitational vector; and a subtractor module adapted to subtract the ambient field vector from said vector corresponding to said magnetic field across said doorway to determine said corrected magnetic field vector.

8. The system as claimed in claim 1, wherein said server implements:

a comparator module adapted to compare the received data with a previously received data to detect an anomaly in the received data, said comparator module, in the event of detecting said anomaly, further adapted to compare the received data with data corresponding to a video footage of said subject passing through said doorway and correct said anomaly; and a display module cooperating with said comparator module, said display module adapted to display the direction of said subject based on the received data and said anomaly, if any, on a display unit of said server.

9. The system as claimed in claim 8, wherein said display module comprises a user interface, and said comparator module, in the event of detecting said anomaly, enables a user to view the video footage of said moving subject passing through said doorway on said display unit and manually correct said anomaly through said user interface.

10. The system as claimed in claim 1, further comprises a location detection system to detect the location of the doorway through which said subject passes.

11. The system as claimed in claim 10, wherein the location detection system is selected from the group consisting of an RFID system and a GPS tracking system.

12. A method for detecting the presence and direction of a subject moving through a doorway amongst a plurality of doorways in a premises, said method comprising the following steps:

positioning at least two magnets on a doorway in a pre-determined orientation to create a magnetic field across the doorway;

sensing perturbations caused by the magnetic field in the event that the subject with a communication unit passes through the doorway and generating signals corresponding to the sensed perturbations;

sensing acceleration experienced by said communication unit and generating signals corresponding to the sensed acceleration;

processing the signals corresponding to the sensed perturbations and said acceleration, wherein said step of processing the signals includes the following steps:

detecting a peak signal from the signals corresponding to the sensed perturbations;

validating the detected peak signal;

determining a gravitational vector based on signals generated by an accelerometer of the communication unit and the validated peak signal;

determining a corrected magnetic field vector based on a vector corresponding to the magnetic field across the doorway and an ambient field vector; and detecting the presence of the subject and the direction of the subject through the doorway based on the gravitational vector and the corrected magnetic field vector;

detecting the presence of the subject and the direction of the subject through the doorway and generating data related to the presence of the subject, the direction of the subject through the doorway, a location of the doorway amongst the plurality of doorways, and a unique identification associated with said communication unit;

transmitting the data; and receiving the data related to the presence and direction of the subject through the doorway, the location of the doorway, and the unique identification.

13. The method as claimed in claim 12, wherein the step of determining the gravitational vector includes the following steps:

filtering the signals generated by the accelerometer, such that the signals at the same time instant of the detected peak signal are filtered; and calculating mean of the filtered signals in X, Y and Z axes and summation of the mean of the filtered signals in X, Y and Z axes to determine the gravitational vector.

14. The method as claimed in claim 12, wherein the step of determining the corrected magnetic field vector includes the following steps:

determining the ambient magnetic field vector; and subtracting the ambient field vector from the vector corresponding the magnetic field across the doorway to determine the corrected magnetic field vector.

15. The method as claimed in claim 12, further comprising the following steps:

comparing the received data with a previously received data to detect an anomaly in the received data;

comparing the received data with data corresponding to a video footage of the subject passing through the doorway in the event of detecting the anomaly, and correcting the anomaly; and displaying the direction of the moving subject based on the received data, and displaying the anomaly, if any.

16. The method as claimed in claim 15, wherein the step of comparing the received data includes the step of enabling a user to view a video footage of the moving subject passing through the doorway, in the event of detecting the anomaly and manually correcting the anomaly.

* * * * *